United States Patent
Hou

(10) Patent No.: US 8,246,902 B2
(45) Date of Patent: Aug. 21, 2012

(54) METHOD FOR MANUFACTURING A PLATE-TYPE HEAT PIPE

(75) Inventor: Chuen-Shu Hou, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 565 days.

(21) Appl. No.: 12/551,433

(22) Filed: Aug. 31, 2009

(65) Prior Publication Data

US 2011/0008198 A1 Jan. 13, 2011

(30) Foreign Application Priority Data

Jul. 8, 2009 (CN) .......................... 2009 1 0304141

(51) Int. Cl.
*B22F 7/02* (2006.01)
(52) U.S. Cl. ................ 419/6; 419/26; 419/36; 419/38; 257/714; 165/104.26
(58) Field of Classification Search ................. 419/6
See application file for complete search history.

(56) References Cited

U.S. PATENT DOCUMENTS

| | | | | |
|---|---|---|---|---|
| 4,703,796 A | * | 11/1987 | Meijer et al. | 165/104.26 |
| 6,410,982 B1 | * | 6/2002 | Brownell et al. | 257/714 |
| 2010/0101761 A1 | * | 4/2010 | Hou | 165/104.26 |

* cited by examiner

*Primary Examiner* — Roy King
*Assistant Examiner* — Christopher Kessler
(74) *Attorney, Agent, or Firm* — Altis Law Group, Inc.

(57) ABSTRACT

A method for manufacturing a plate-type heat pipe includes providing a mold including a first cavity and a plurality of second cavities and depositing cores into the mold. Each core has a first portion in the first cavity and a second portion in a corresponding second cavity. First and second metal powder are filled into the mold. The cores are then removed from the mold to form a green piece by the first and second metal powder, which has first and second chambers therein. The green piece is sintered, whereby the first metal powder forms an outer wall of the heat pipe and the second metal powder forms a wick structure. The heat pipe has a heat absorbing portion having the first chambers and fins having the second chambers communicating with the first chambers.

12 Claims, 7 Drawing Sheets

METHOD FOR MANUFACTURING A PLATE-TYPE HEAT PIPE

BACKGROUND

1. Technical Field

The disclosure relates to a method for manufacturing a heat pipe, and more particularly to a method for manufacturing a plate-type heat pipe.

2. Description of Related Art

Generally, plate-type heat pipes efficiently dissipate heat from heat-generating components such as a central processing unit (CPU) of a computer. A conventional plate-type heat pipe comprises a case formed by stamping a metal sheet and a number of fins welded on a top of the case to dissipate heat of the case. The case contains working fluid therein. A wick structure is laid on an inner wall of the case. The welded connection between the case and the fins has a thermal resistance hindering a heat transfer from the case to the fins.

It is therefore desirable to provide a method for manufacturing a plate-type heat pipe overcoming the shortcomings of the conventional art.

DETAILED DESCRIPTION

Figure 1:
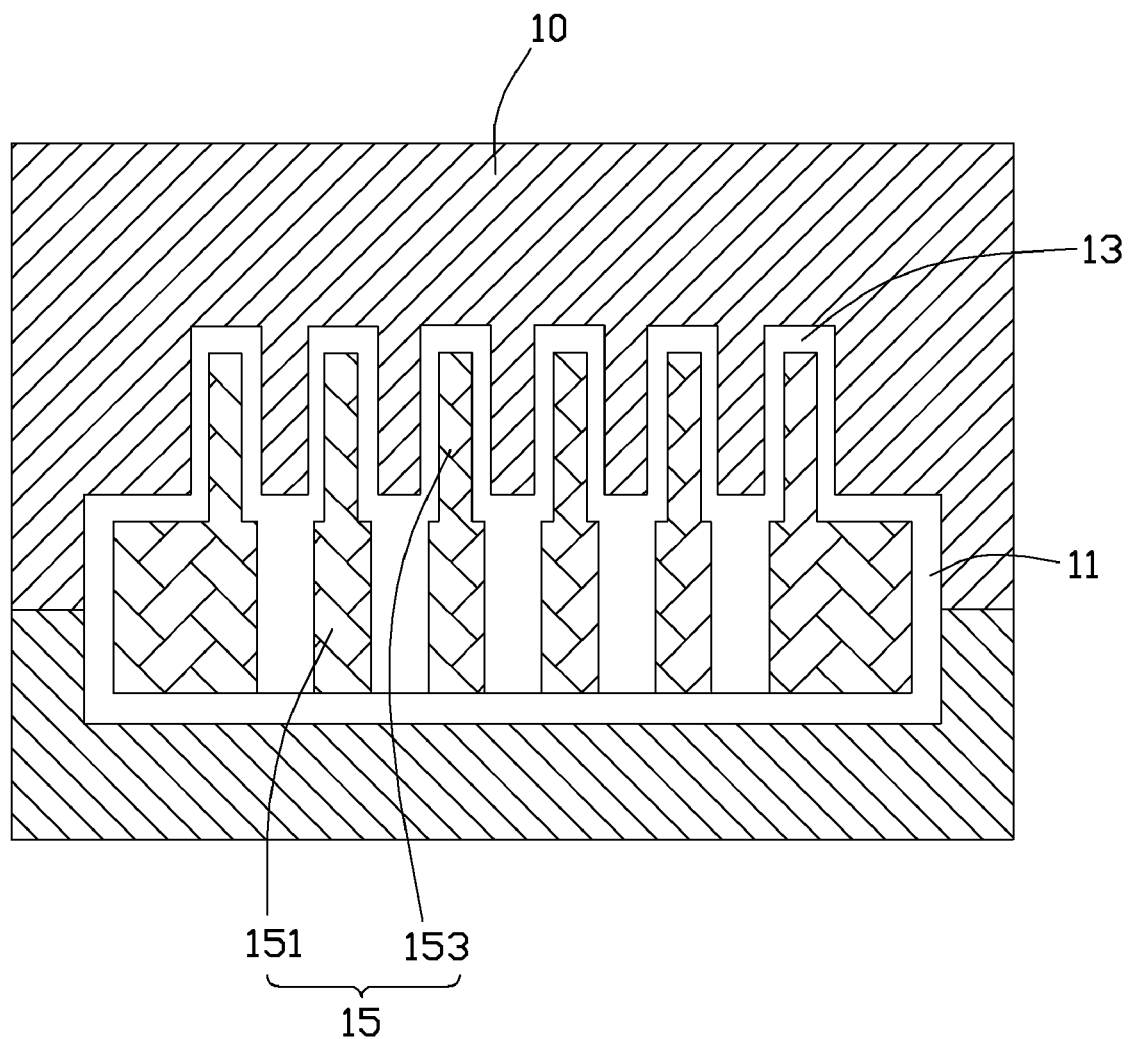
FIG. 1 is a cross-sectional view showing a mold for forming a plate-type heat pipe in accordance with a first embodiment of the disclosure.
Figure 2:
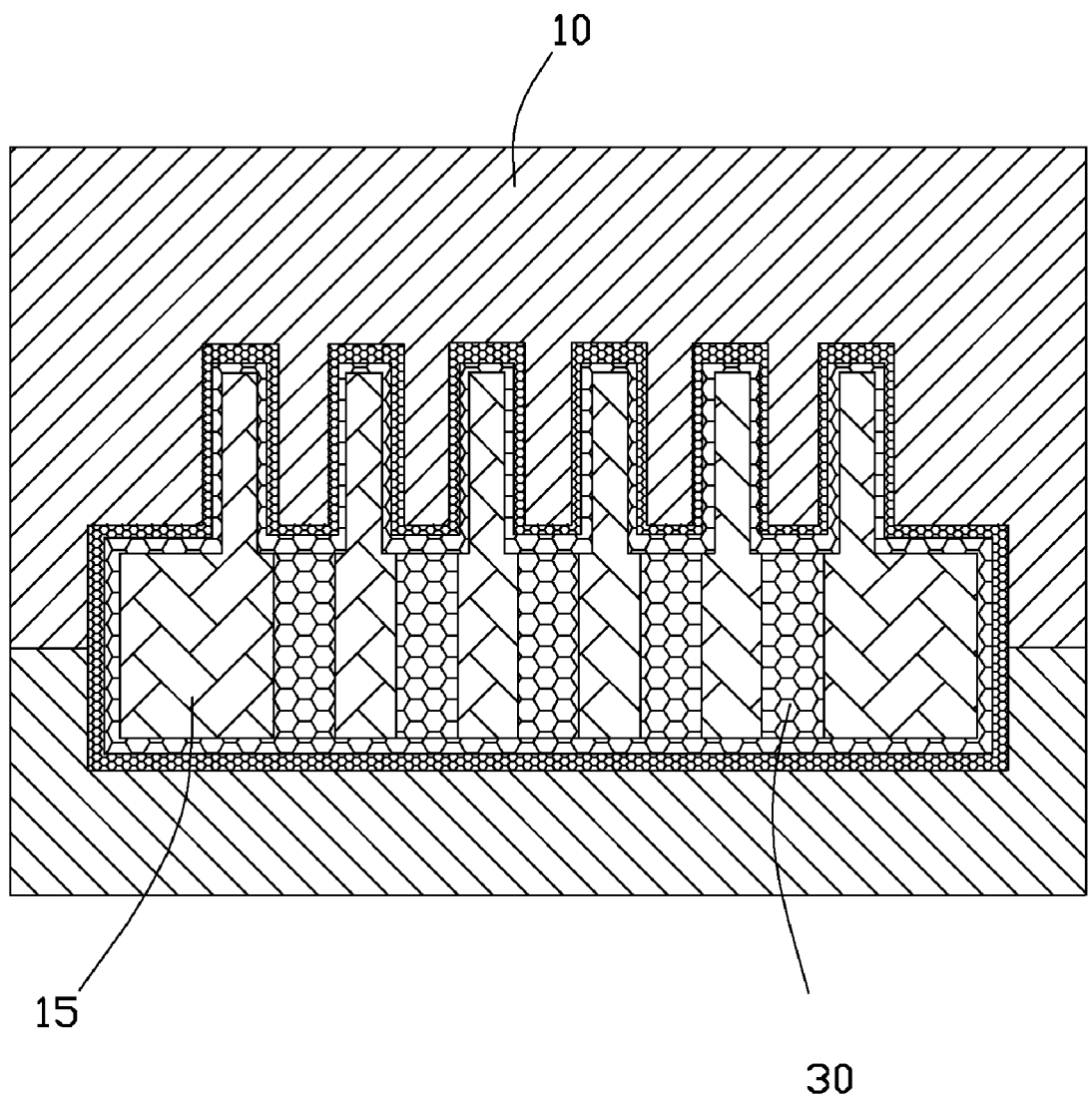
FIG. 2 is a cross-sectional view of a green piece for forming the plate-type heat pipe in accordance with the first embodiment of the disclosure, wherein the green piece is formed by and in the mold of FIG. 1.
Figure 3:
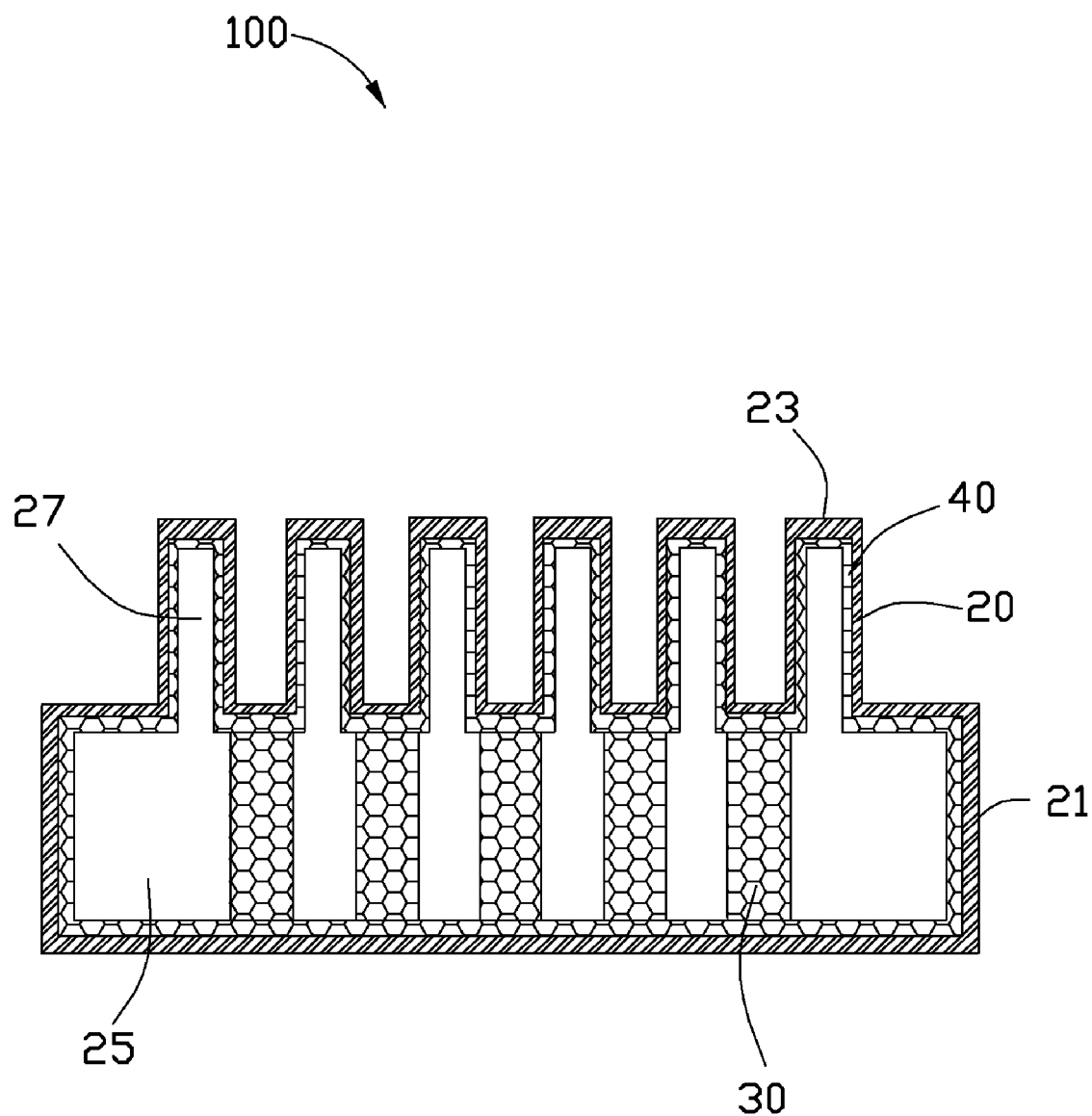
FIG. 3 is a cross-sectional view of a plate-type heat pipe obtained from the green piece of FIG. 2 in accordance with the first embodiment of the disclosure.

Referring to FIGS. 1-3, a method for manufacturing a plate-type heat pipe 100 in accordance with a first embodiment of the disclosure will be explained in the following.

Firstly, a mold 10 is provided. The mold 10 consists of an upper part (not labeled) and a lower part (not labeled). When the upper and lower parts are assembled together as shown in FIG. 1, the mold 10 defines a large, cuboidal first cavity 11 and a number of small, cuboidal second cavities 13 located at a top, central portion of the first cavity 11. The first cavity 11 and the second cavities 13 communicate with each other. The first and second cavities 11, 13 cooperatively define a cavity which has a structure and size corresponding to those of the plate-type heat pipe 100.

Secondly, a number of spaced cores 15 made of a releasable material are deposed in the mold 10. Each of the cores 15 comprises a cuboidal first portion 151 and a cuboidal second portion 153 extending upwardly from a top end of the first portion 151. The first portions 151 are evenly spacedly located at the first cavity 11 of the mold 10. The top ends and bottom ends of the first portions 151 space from a top edge and a bottom edge of the first cavity 11 of the mold 10 a distance of 0.2~0.7 mm. A distance between a left end of a leftmost first portion 151 and a left edge of the first cavity 11 of the mold 10 and a distance between a right end of a rightmost first portion 151 and a right edge of the first cavity 11 of the mold 10 each ranges from about 0.2 mm to about 0.7 mm. An interval between the two adjoining first portions 151 of the cores 15 is narrower than a distance between two corresponding adjoining second cavities 13. The second portion 153 is inserted in the second cavity 13 of the mold 10. Atop end and lateral ends of the second portion 153 space from a top edge and lateral edges of the second cavity 13 of the mold 10 a distance of 0.2~0.7 mm.

Thirdly, a first metal powder with adhesive is provided. A second metal powder with adhesive is provided. A particle diameter of the first metal powder is varied from 5 μm to 20 μm. A particle diameter of the second metal powder is varied from 50 μm to 150 μm. The first and second metal powder are respectively injected into the first and second cavities 11, 13 of the mold 10 using two injection systems with opposite injection directions. As a result, the first metal powder is adhered on a whole inner surface of the mold 10 and spaced from the cores 15. The second metal powder fills spaces between the first metal powder and the cores 15 and the intervals between the first portions 151 of the cores 15. The injection systems are in a double-mode injection molding machine (not shown).

Fourthly, the cores 15 are removed from the first and second metal powder by thermal cracking reaction or chemical reaction to obtain a green piece. Therefore, a number of hollow first chambers 25 and second chambers 27 are defined in the green piece. The first chambers 25 and the second chambers 27 communicate with each other.

Finally, the green piece with the first and second chambers 25, 27 undergoes a series of processes to become the plate-type heat pipe 100. The green piece is disposed in a sintering oven and sintered at a high temperature, whereby the first and second metal powders are bounded together to obtain a sintered working piece. The first and second chambers 25, 27 are vacuumed and filled with a working fluid (not shown) such as water, alcohol, methanol, or the like, via a port in the working piece. Finally, the port in the work piece is hermetically sealed. As a result, the desired plate-type heat pipe 100 is obtained and includes a tight, hermetic outer wall 20, a continuous wick structure 40 adhered on an inner surface of the outer wall 20, and a number of porous supporting poles 30. The outer wall 20 is made of the first metal powder. The wick structure 40 and the supporting poles 30 are made of the second metal powder. A part of the plate-type heat pipe 100 located corresponding to the first cavity 11 of the mold 10 forms a cuboidal heat absorbing portion 21 with the first chambers 25. Another part of the plate-type heat pipe 100 located corresponding to the second cavities 13 of the mold 10 forms a number of hollow fins 23 with the second chambers 27. Opposite ends of the supporting pole 30 abut against the wick structure 40 which is located at a bottom surface of a joint of the two adjoining fins 23 and a top surface of the heat absorbing portion 21. The supporting poles 30 reinforce the structural strength and integrity of the plate-type heat pipe 100, and form paths which facilitate condensed working fluid to return to a bottom of the plate-type heat pipe 100 from the fins 23.

Each of the cores 15 is comprised of a polymer or waxy material. After the cores 15 are removed, the green piece defines the first and second chambers 25, 27 to receive the working fluid. The supporting poles 30 and the wick structure 40 are porous and communicate with each other; therefore, the working fluid can quickly flow from top ends of the wick structure 40 adhered on the fins 23 to a bottom end adhered on the heat absorbing portion 21 along lengthways directions of the supporting poles 30. The fins 23 integrate with the heat absorbing portion 21 of the plate-type heat pipe 100 and the second chambers 27 of the fins 23 communicate with the first chambers 25 of the heat absorbing portion 21. Thus, heat resistance between the fins 23 and the heat absorbing portion 21 is significantly reduced relative to the conventional plate-type heat pipe. The heat dissipation efficiency of the plate-type heat pipe 100 is accordingly improved.

Figure 4:
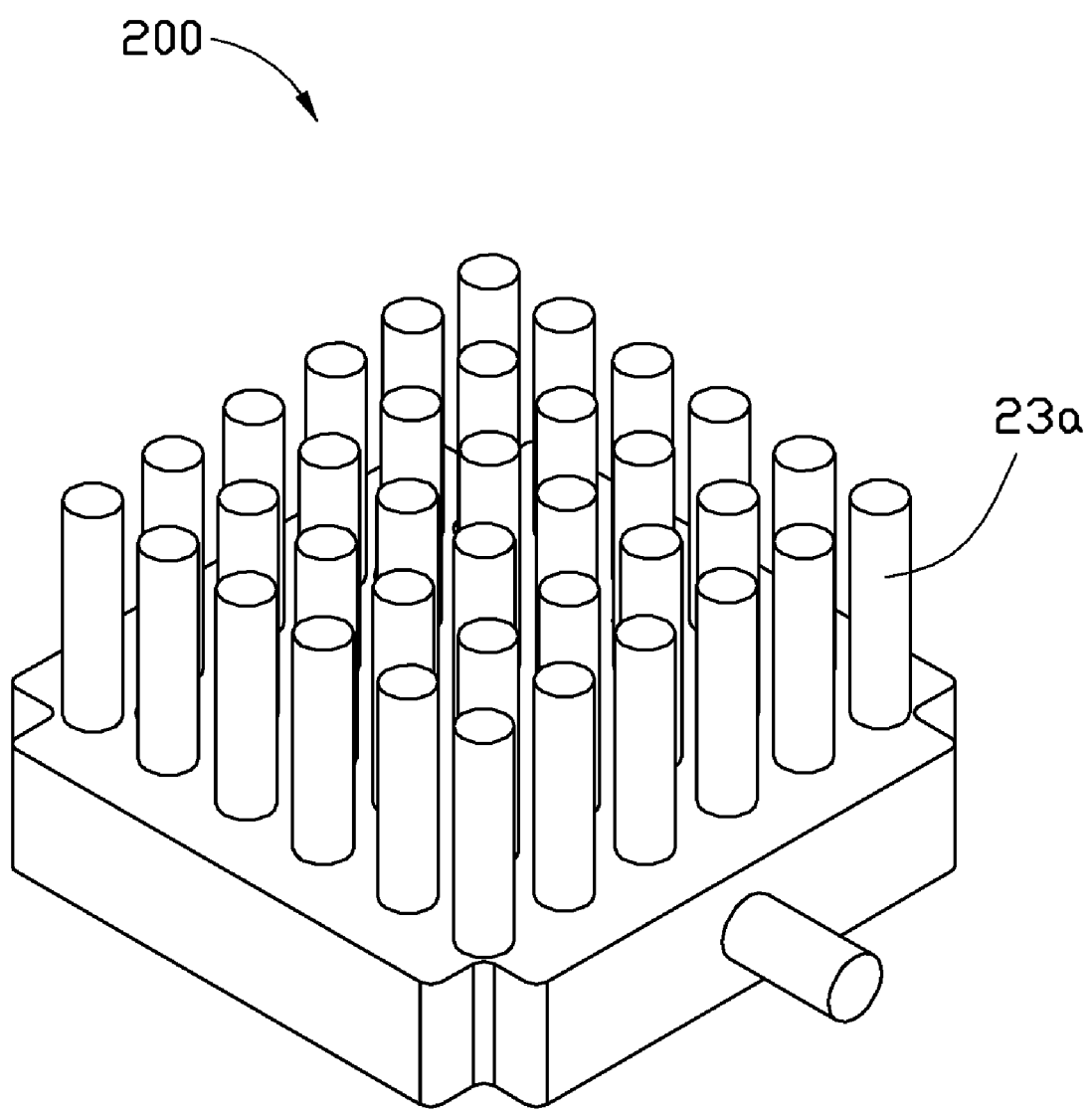
FIG. 4 is an isometric view of a plate-type heat pipe in accordance with a second embodiment of the disclosure.

Referring to FIG. 4, a plate-type heat pipe 200 is manufactured using the method previously described. The plate-type heat pipe 200 is similar to the plate-type heat pipe 100. Difference between the plate-type heat pipes 100, 200 is that each of the fins 23a of the plate-type heat pipe 200 has a hollow, round rod-shaped configuration.

Figure 5:
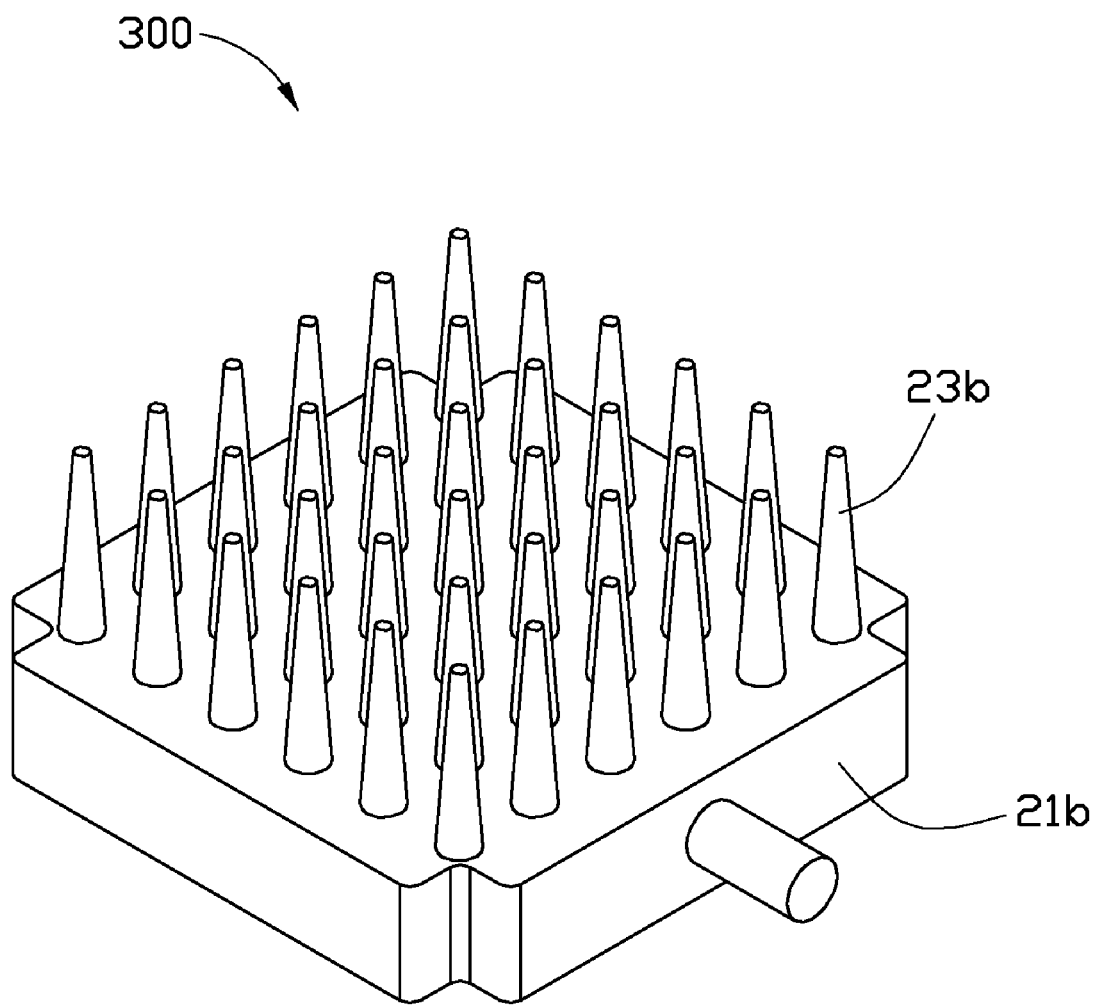
FIG. 5 is an isometric view of a plate-type heat pipe in accordance with a third embodiment of the disclosure.

Referring to FIG. 5, a plate-type heat pipe 300 is manufactured using the method previously described. The plate-type heat pipe 300 is similar to the plate-type heat pipe 100. Difference between the plate-type heat pipes 100, 300 is that each of the fins 23b of the plate-type heat pipe 300 has a hollow, circular frustum-shaped configuration. A bottom end of each of the fins 23b which has the largest diameter connects with a heat absorbing portion 21b of the plate-type heat pipe 300.

Figure 6:
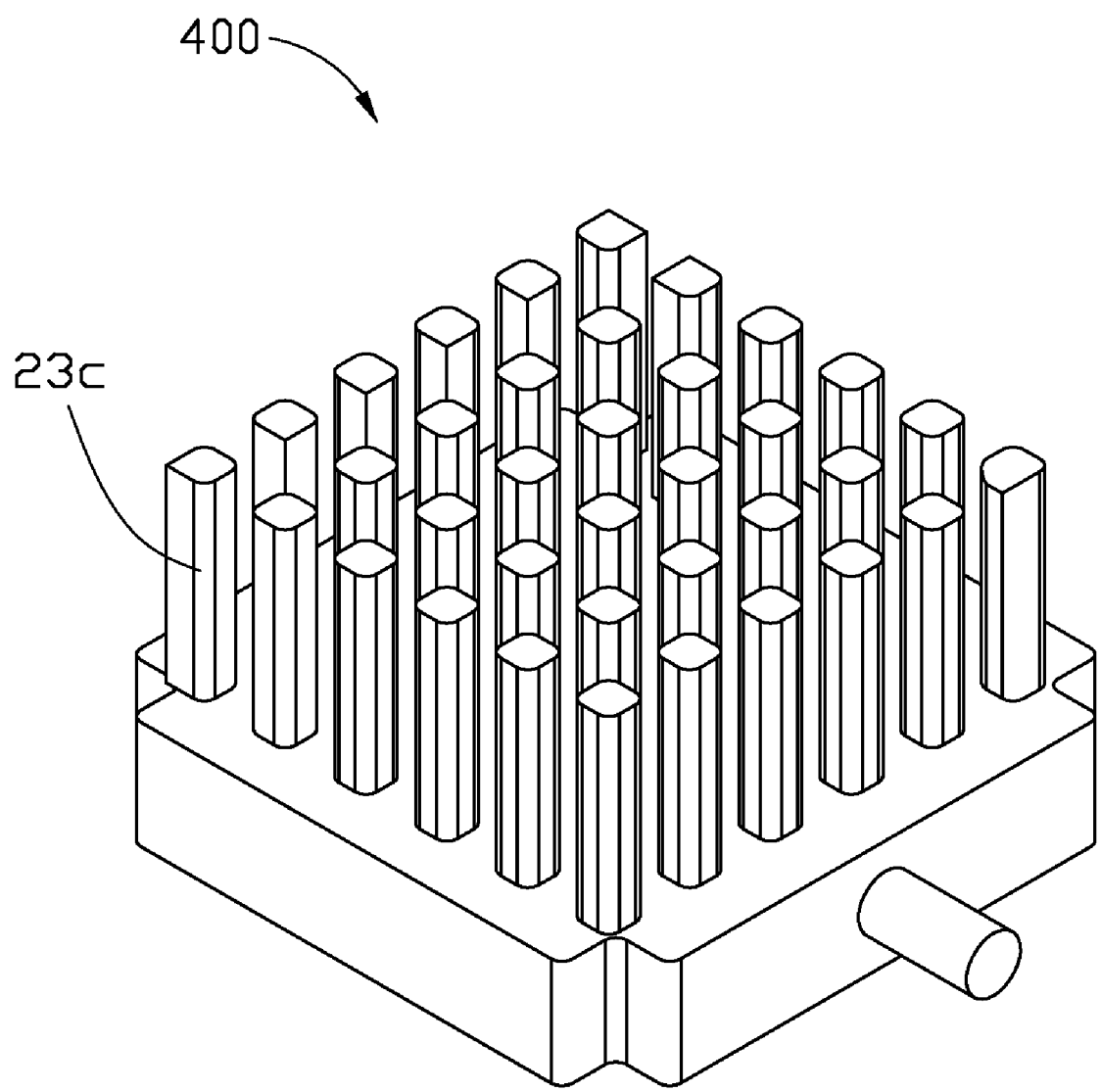
FIG. 6 is an isometric view of a plate-type heat pipe in accordance with a fourth embodiment of the disclosure.

Referring to FIG. 6, a plate-type heat pipe 400 is manufactured using the method previously described. The plate-type heat pipe 400 is similar to the plate-type heat pipe 100. Difference between the plate-type heat pipes 100, 400 is that each of the fins 23c of the plate-type heat pipe 400 has a hollow, a rectangular rod-shaped configuration configuration.

Figure 7:
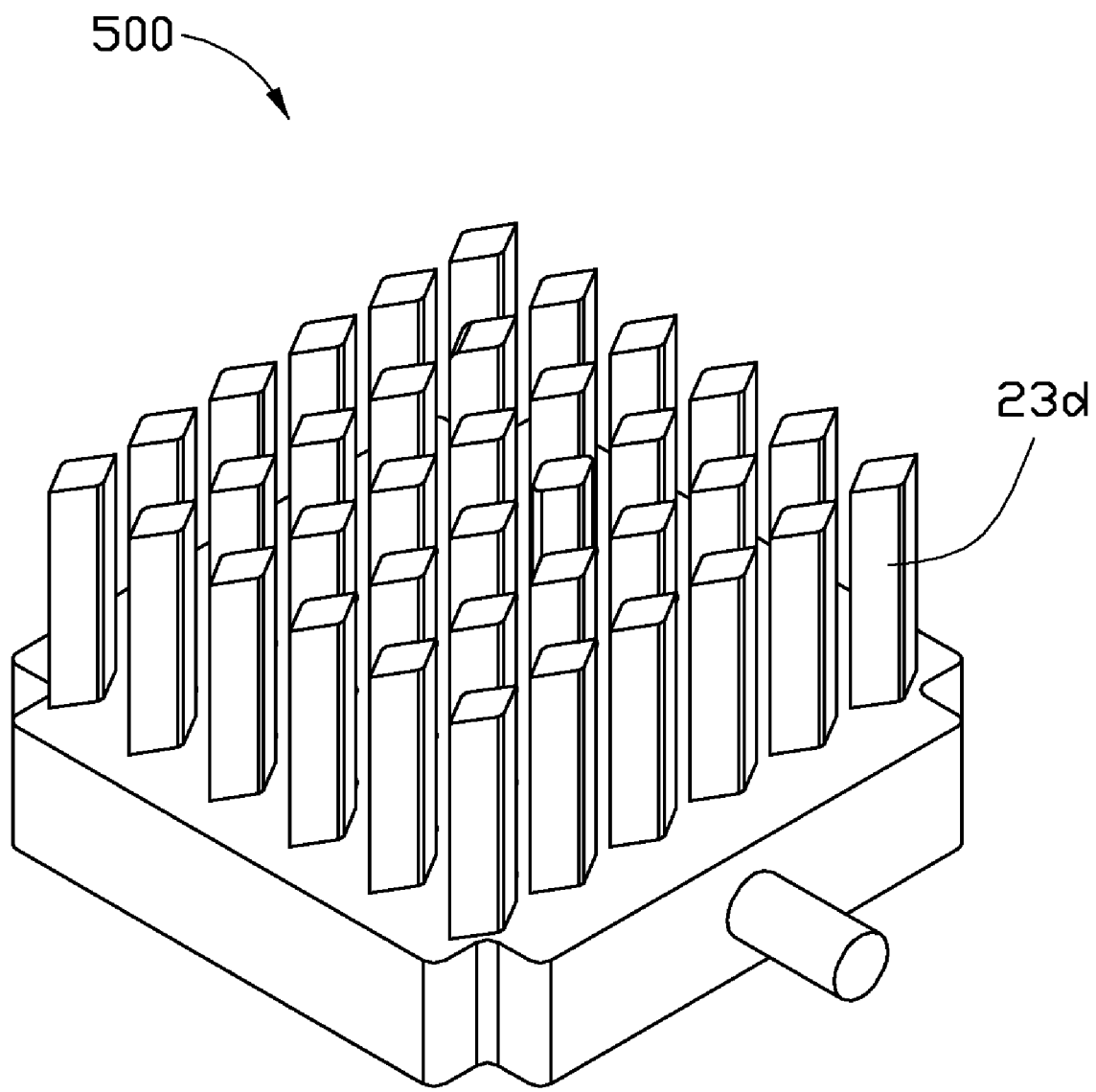
FIG. 7 is an isometric view of a plate-type heat pipe in accordance with a fifth embodiment of the disclosure.

Referring to FIG. 7, a plate-type heat pipe 500 is manufactured using the method previously described. The plate-type heat pipe 500 is similar to the plate-type heat pipe 100. Difference between the plate-type heat pipes 100, 500 is that each of the fins 23d of the plate-type heat pipe 500 has a hollow, rhombus rod-shaped configuration. The fins 23d are arranged into a matrix with a plurality of rows and columns. Two neighboring fins 23d of a same column is spaced a distance smaller than that between two neighboring fins 23d of a same row.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a plate-type heat pipe comprising:
providing a mold comprising a first cavity and a plurality of second cavities located at a top of the first cavity and communicating with the first cavity;
depositing a plurality of cores into the mold, each of the cores having a first portion located at the first cavity of the mold and a second portion extending from the first portion into one of the second cavities of the mold, the first and second portions of the cores being spaced from the mold a distance;
filling a first metal powder and a second metal powder respectively into the first and second cavities of the mold in such a manner that the first metal powder is adhered on an inner surface of the mold and spaced from the cores, the second metal powder is filled within interval between the first metal powder and the cores, and interval between the first portions of the cores;
removing the cores from the mold to form a green piece by the first and second metal powder, wherein the green piece has a number of first and second chambers therein;
sintering the green piece with the first and second chambers defined therein to obtain a sintered work piece, wherein the sintered work piece has a heat absorbing portion with the first chambers and a number of fins extending upwardly from a top side of the heat absorbing portion, each of the fins has one of the second chambers which communicates with the first chamber;
vacuuming the first and second chambers;
injecting working fluid into the first and second chambers via a port in the sintered work piece; and
sealing the port of the sintered work piece.

2. The method for manufacturing a plate-type heat pipe as in claim 1, wherein the first metal powder forms a tight, hermetic outer wall of the plate-type heat pipe, and the second metal powder forms a wick structure adhered on an inner surface of the outer wall and a plurality of porous supporting poles.

3. The method for manufacturing a plate-type heat pipe as in claim 2, wherein an interval between adjoining two of the first portions of the cores is smaller than a distance between two corresponding adjoining second cavities, and the second metal powder filled in the interval between the adjoining two of the first portions of the cores forms one of the supporting poles.

4. The method for manufacturing a plate-type heat pipe as in claim 3, wherein opposite ends of each of the supporting poles abut against the wick structure which is located at a bottom surface of a joint of two adjoining fins and a top surface of the heat absorbing portion, which is opposite to the bottom surface.

5. The method for manufacturing a plate-type heat pipe as in claim 3, wherein each of the second cavities of the mold and the second portion of each of the cores has one of following configurations: a cuboidal configuration, a round rod-shaped configuration, a rectangular rod-shaped configuration, a rhombus rod-shaped configuration and a circular frustum-shaped configuration, and the second cavities are spaced from each other.

6. The method for manufacturing a plate-type heat pipe as in claim 5, wherein the second cavities of the mold are arranged in a matrix.

7. The method for manufacturing a plate-type heat pipe as in claim 5, wherein the first cavity of the mold is cuboidal.

8. The method for manufacturing a plate-type heat pipe as in claim 1, wherein a particle size of the first metal powder is smaller than that of the second metal powder.

9. The method for manufacturing a plate-type heat pipe as in claim 1, wherein each of the cores is made of one of a polymer material and a waxy material.

10. The method for manufacturing a plate-type heat pipe as in claim 1, wherein each of the cores is removed from the green piece by one of thermal cracking and chemical reaction.

11. The method for manufacturing a plate-type heat pipe as in claim 1, wherein the first and second metal powder are filled in the mold by using a double-mode injection molding machine.

12. The method for manufacturing a plate-type heat pipe as in claim 2, wherein the outer wall and the wick structure together have a thickness 0.2~0.7 mm.

* * * * *